(12) United States Patent
Grise et al.

(10) Patent No.: US 8,423,847 B2
(45) Date of Patent: Apr. 16, 2013

(54) MICROCONTROLLER FOR LOGIC BUILT-IN SELF TEST (LBIST)

(75) Inventors: Gary D. Grise, Colchester, VT (US); David E. Lackey, Jericho, VT (US); Steven F. Oakland, Colchester, VT (US); Donald L. Wheater, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/469,604

(22) Filed: May 11, 2012

(65) Prior Publication Data

US 2012/0221910 A1   Aug. 30, 2012

Related U.S. Application Data

(60) Continuation of application No. 12/268,583, filed on Nov. 11, 2008, now Pat. No. 8,205,124, which is a division of application No. 11/276,413, filed on Feb. 28, 2006, now Pat. No. 7,490,280.

(51) Int. Cl.
*G01R 31/28* (2006.01)

(52) U.S. Cl.
USPC ........................................................ 714/733

(58) Field of Classification Search .................. 714/733
See application file for complete search history.

(56) References Cited

U.S. PATENT DOCUMENTS

| | | | |
|---|---|---|---|
| 5,535,223 A * | 7/1996 | Horstmann et al. ......... 714/744 |
| 5,577,050 A | 11/1996 | Bair et al. |
| 6,343,366 B1 | 1/2002 | Okitaka |
| 6,553,527 B1 | 4/2003 | Shephard, III |
| 6,598,192 B1 | 7/2003 | McLaurin et al. |
| 6,665,817 B1 | 12/2003 | Rieken |
| 6,807,645 B2 | 10/2004 | Angelotti et al. |
| 6,839,873 B1 | 1/2005 | Moore |
| 7,017,094 B2 | 3/2006 | Correale, Jr. et al. |
| 7,155,651 B2 | 12/2006 | Nadeau-Dostie et al. |
| 7,222,280 B1 | 5/2007 | West et al. |
| 7,243,283 B2 | 7/2007 | Onodera |
| 7,254,762 B2 | 8/2007 | Anzou et al. |
| 7,269,766 B2 | 9/2007 | Slobodnik et al. |
| 7,284,173 B2 | 10/2007 | Napolitano |
| 7,305,598 B1 | 12/2007 | Sanghani et al. |
| 7,461,309 B2 | 12/2008 | Kiryu |
| 7,549,099 B2 | 6/2009 | Kantake |
| 2003/0074621 A1 | 4/2003 | Dorsey |
| 2003/0120985 A1 | 6/2003 | Slobodnik et al. |
| 2004/0103355 A1 | 5/2004 | Correale, Jr. et al. |
| 2006/0190781 A1 | 8/2006 | Farmer et al. |

* cited by examiner

*Primary Examiner* — James C Kerveros
(74) *Attorney, Agent, or Firm* — David Cain; Roberts Mlotkowski Safran & Cole, P.C.

(57) ABSTRACT

Built-in self-test (BIST) microcontroller integrated circuit adapted for logic verification. Microcontroller includes a plurality of hardware description language files representing a hierarchical description of the microcontroller, the plurality of hardware description language files including a library of circuit design elements, a plurality of library design circuit elements adapted to store a uniquely defined set of input and output signals to enable a logic BIST, and a plurality of latches adapted to store a plurality of values corresponding to a behavioral profile of a test clock.

17 Claims, 6 Drawing Sheets

MICROCONTROLLER FOR LOGIC BUILT-IN SELF TEST (LBIST)

CROSS-REFERENCE TO RELATED APPLICATIONS

The present application is a continuation of U.S. application Ser. No. 12/268,583 filed Nov. 11, 2008, now U.S. Pat. No. 8,205,124, which is a divisional of U.S. application Ser. No. 11/276,413 filed Feb. 28, 2006, now U.S. Pat. No. 7,490,280, the disclosures of which are expressly incorporated by reference herein in their entirety.

DESCRIPTION

1. Field of the Invention

The instant invention relates to an At Speed Logic Built In Self Test (LBIST) which utilizing programmable at speed test structures incorporated into a design for manufacturing test such as At Speed Structural Test (ASST) structures.

2. Background Description

An At Speed Structural Test (ASST) capability to application-specific integrated circuit (ASIC) offerings is disclosed in copending U.S. patent application Ser. No. 10/906,407, the disclosure of which is expressly incorporated by reference herein in its entirety. The ASST test structures described here are programmable and tests clock domain by clock domain. These structures are programmable through scan chains and provide a chip fully constrained for manufacturing test. A fully constrained design is one where control of the on board clock generation circuits (PLLs and clock formatters) are under scan programming control for manufacturing test. In order to perform these tests, design for test (DFT) logic was added to the chip design in a manner which facilitates the inclusion of an At Speed LBIST described in this patent. These controls are slow (not at functional speeds) and the logic in copending U.S. patent application Ser. No. 10/906,407 causes the at speed clock responses to occur.

The state of the art today is for a custom LBIST to be designed for each chip design. This custom LBIST design is very labor insensitive, time consuming and requires an intimate knowledge of the design and engineering expertise. Each design is unique and not reusable.

The ASST approach described in U.S. patent application Ser. No. 10/906,407 is a DFT process which results in a fully constrained chip in which the phase locked loop (PLL) operation, turning clocks off and on, setting up clock trees for test are under test control through programming bits. The programming necessary for ASST testing is determined from the manufacturing test for the specific chip, and the testing is accomplished by loading scan bits in the design. This ASST structure can then be coupled with a microcontroller which can be supplied with scan bits determined during manufacturing test generation to deliver a LBIST solution.

SUMMARY OF THE INVENTION

The present invention provides a built-in self-test (BIST) microcontroller integrated circuit adapted for logic verification. The BIST includes a plurality of hardware description language files representing a hierarchical description of the microcontroller, in which the plurality of hardware description language files including a library of circuit design elements. A plurality of temporary library design circuit elements are adapted to store a uniquely defined set of input and output signals to enable a logic BIST, and a plurality of latches are adapted to store a plurality of values corresponding to a behavioral profile of a test clock.

According to a feature of the invention, the plurality of temporary library design circuit elements can include storage elements that store instructions and data generated during manufacturing test. Further, the storage elements may include a read only memory (ROM), or the storage elements may include a random access memory (RAM).

In accordance with the invention, the plurality of latches can be clock gating latches. Moreover, the microcontroller can be utilized for at speed structural testing of chips.

The present invention is directed to a controller for performing structural testing of chips. The controller includes a general purpose test register store structured and arranged to store data bits structural testing of each chip under test, a clock generator arranged to send clock signals to the each chip, and a program store structured and arranged to store a test sequence. The data bits are utilized in formatting the clocks for testing.

According to a feature of the invention, the data bits include data from a manufacturing test run on the each chip. Further, the clock generator can turn test clocks on the each chip on and off. A phase locked loop can be run with the stored data bits to test the each chip. Moreover, a plurality of general purpose test registers can be included for testing a plurality of different chip designs.

In accordance with the invention, the controller can include a spreader coupled to the general purpose test register and to scan chains of the each chip. Outputs of the spreader are coupled to internal lines of the each chip. The controller can also include a device to read a result from the each chip with an expected result. The device to read the result can be a multiple input signature register. Further, the program in the program store can be changed.

The present invention is directed to a process for structure testing of chips. The process includes ascertaining controlling data bits during a manufacturing test of a chip, formatting test clocks with the controlling data bits, forwarding a test signal to each internal line of the chip, and comparing a result of the test signal to an expected result.

According to a feature of the invention, a phase locked loop is run with the controlling data bits to test the chip under test. Further, a plurality of chips can be tested simultaneously and/or a plurality of chips can be tested serially. A multiple integer signature register can compare the result of the test signal to the expected result.

The process can further include changing a test program stored on a microcontroller device controlling the process.

In accordance with the invention, inputs are loaded in parallel to determine how outputs react. Further, a general purpose test register can store the ascertained controlling data bits and a spreader, coupled to the general purpose test register can forward the test signal to each internal line of the chip.

The present invention is directed to a process for structurally testing a chip. The process includes starting clocks associated with the chip, formatting at least one of the clocks for each test sequence using stored data bits associated with a manufacturing test of the chip, and comparing an output of each test sequence to an expected output.

According to the invention, deskewers sitting at outputs of a phase locked loop format the at least one clock for each test sequence. Moreover, a phase locked loop can start the clocks and a deskewer can allow pulses through the chip. A pseudo-random pattern may be scanned into the chip for each test sequence. Further, a general purpose test register can store the stored data bits for formatting the clock, and the general purpose test register can further store program bits for phase locked loop control of the testing of the chip.

DETAILED DESCRIPTION OF THE PRESENT INVENTION

Figure 1:
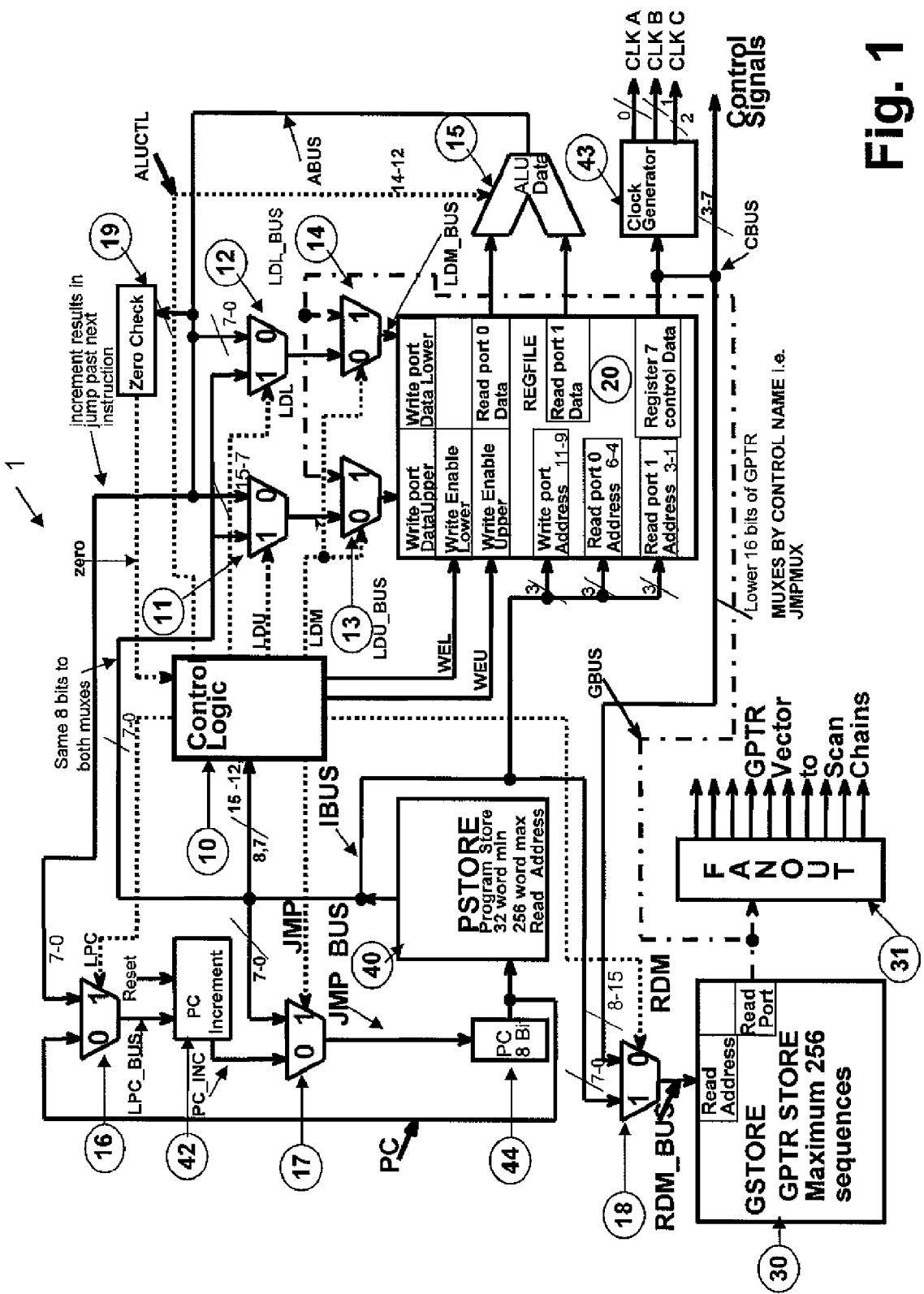
FIG. 1 schematically illustrates an exemplary embodiment of a microcontroller in accordance with the instant invention.

The present invention provides a method to easily add logic built-in self test (LBIST) to designs which are compatible with the manufacturing test implemented in copending U.S. patent application Ser. No. 10/906,407, and which can be used by customers for in system testing. The above-noted application adds an At Speed Structural Test (ASST) capability to application-specific integrated circuit (ASIC) offerings. The ASST test is programmable and tests clock domain by clock domain. Heretofore, traditional LBIST required custom sequencers to be designed for each design which in turn drives custom test effort at manufacturing test.

The present LBIST solution can be added to a chip design as a general library element and automatically inserted into a chip design. The design is reusable over any chip which has been designed appropriately. This approach is superior to the prior state of the art as it delivers a low labor LBIST, does not require the detailed understanding of the design and reduces the time to deliver the LBIST solution. This microcontroller approach could be used with other similar DFT solutions which result in a programmable fully constrained chip under test.

The instant invention relates to a programmable LBIST controller which, as a core design in an ASIC library, can be added to a design through DFTS and, therefore, eliminates the semi-custom effort. In addition, the LBIST utilizes the data generated during the manufacturing test, which sets up each clock domain for a test sequence and, therefore, improves the verification and correlation effort and reduces design effort as LBIST results can easily be duplicated in the manufacturing test.

This LBIST design requires a device to scan in a bit sequence which configures the clock trees and sets up a domain for test and supplies the necessary clocking and signals to kick off each LBIST test sequence. This bit sequence for programming the clock trees and setting up the domains for test was determined during the generation of the manufacturing test. Typically the manufacturing test is what is known in the industry as deterministic testing, where patterns are stored on the tester which specifically target faults. For LBIST testing, the same programming of the clock trees and setting up the domains for test is required, however, pseudo-random patterns would be generated on the chip. So a typical linear shift feedback register (LSFR) and spreader, which are well known in the industry, would be utilized in the design. To accomplish LBIST control, a core can be designed which is a general purpose microcontroller to use the scan data determined during the manufacturing ASST test to run LBIST.

The microcontroller provides a library core to programmably set up clock trees for ASST testing that uses the scan bit data generated during manufacturing test to set up the clock trees. The programmable features allow different scan chain lengths as well as different control signals to be easily accommodated. The at speed LBIST described here could be utilized during manufacturing testing in addition to the typical deterministic manufacturing testing to determine whether the chip will work, and can test the chip in the system, e.g., to test all chips during the powering up of a system incorporating a number of such ASICS.

FIG. 1 illustrates an example of a microcontroller in accordance with the instant invention. However, it is noted that other microcontroller designs may be utilized without departing from the spirit and scope of the instant invention. As illustrated, microcontroller 1 employs a minimal gate count design, which allows flexible control of control signals and utilizes the register control data generated during test. Additional arithmetic logic unit (ALU) and data handling capability could be added but such added capability grows the instruction width and logic size and is a tradeoff between program size and silicon costs. Also the microcontroller as illustrated is shown where each instructions would execute in a single clock cycle as the scan speed or speed of a joint test action group (JTAG) clocked implementation is generally slow compared to the logic speed. However, if a faster microcontroller was desired, common techniques such as pipelining could be employed to increase performance but would increase the area required for the design.

Microcontroller 1 includes a control logic 10 that receives an instruction from a program store (PSTORE) 40 and decomposes that instruction into the necessary control signals that determine how data is to flow through logic 10, what operation ALU 15 is to perform, and if data is to be written into the register file (REGFILE) 20. Control logic 10 is coupled to write enable upper (WEU) and write enable lower (WEL) control lines of REGFILE 20. This allows more efficient use of REGFILE 20 which acts as a "scratch pad." By selectively allowing only the upper or lower half of a register to be written. Control logic 10 is also coupled to control data entering REGFILE 20 through a number of gates (muxes) 11, 12, 13, 14. Gates 11 and 12 allow selection of the data source for the REGFILE 20 from either the PSTORE 40 or from ALU 15. The control lines load data upper (LDU), load data lower (LDL) allow partitioning the data input between the upper or lower half of the register file, and load data muxes (LDM) control lines allow the data source to be from the GPTR store 30. Gates 13 and 14 are respectively coupled to a write data port upper and write data port lower of REGFILE 20. Further, control logic 10 is coupled to control lines (ALUCTL) into ALU 15. ALU 15 can be designed to include functioning allowing a no operation (NOP) on data from read port 0, incrementing, masking, and testing of results to basically accomplish a tester onboard the chip. ALU 15 receives data from data read port 0 and a data read port 1 of REGFILE 20 and puts the result on the ALU data bus ABUS.

Control logic 10 also controls gate 16 with control line (LPC) which is a MUX which allows the address for PSTORE 40 to be loaded from the ALU 15 result. This allows computed program jumps. Control logic 10 also controls a gate 17, another MUX, through a control line (JMP) to allow the address to come from the program instead of the program counter 42, and controls gate 18 with control line RMD to allow the GPTR store 30 address to come from the upper half or register 7 instead of from PSTORE 40.

Register 7 of REGFILE 20 is used to provide test clock control signals through the lower half of said register which is coupled to an A, B, and C clock generator 43 provided to turn on and off test clocks, i.e. for a LSSD design, clk A clk B and clk C, on the chip under test. For a MUXSCAN design, the clock generator 43 would provide the SE and the B clocks needed for test.

GPTR store 30 holds the information needed for the LBIST testing which was generated during the manufacturing test, as discussed in copending U.S. patent application Ser. No. 10/906,407, the disclosure of which is expressly incorporated by reference herein in its entirety. The GPTR could be implemented as ROM for a fixed implementation of the test program or as a larger RAM for an implementation which could be loaded and therefore changed as desired, the same implementation flexibility applies to PSTORE 40. Thus, GPTR store 30 holds the data bits to be added into the deskewer for clock formatting and the program bits needed for phase locked loop (PLL) control for testing the chip, the number of scan cycles needed to load these control bits for a test, the number of passes needed per test, and the number of different tests to be run. By way of example, the typical PLL control can be configured through control lines such that a voltage controlled oscillator runs a customizable divide output, e.g., divide by 10, for control under manufacturing test, flip-flops are inserted in series with these control lines. These flip-flops as designed so that they flush the designers inputs through in normal use mode but in a test mode such as manufacturing test or LBIST, they can be programmed to different values to allow custom divider outputs as needed for effective testing.

A read port of GPTR store 30 is coupled to a spreader 31 having a number of outputs coupled to a number of scan in ports of the chip under test. Spreader 31 may preferably be part of an automatic DFT insertion process to connect GPTR store 30 to appropriate scan chains or the placement of the scan bits for clock control could always occur on one or several scan in ports to facilitate the insertion process. The number of outputs of spreader 31 corresponds to the number of scan in ports on which the clock control scan bits are placed.

To reduce the program complexity and test time required to set up each test, the PLL and clock control scan bits (as described in copending U.S. patent application Ser. No. 10/906,407 should be placed at the head of each scan chain utilized so that scan bits not utilized in clock control are not being scanned through to setup each test. Such placement of scan bits at the head of scanchains is a capability generally found in commonly available DFT tools.

Further, read port of GPTR store 30 is coupled to an input of gates 13 and 14. The other inputs to gates 13 and 14 are coupled to the respective outputs of gates 11 and 12. This allows data from the GPTR store 30 to be input into REGFILE 20 for such operations as the number of scan cycles needed to load the control bits. GPTR store 30 could be implemented as a growable RAM so the data size could be easily altered to fit customer needs. However, if more than one chip design on a system board is to be tested, memory external to the chip designs could be placed on the system board to store the data bits for this additional testing rather than increasing the RAM of GPTR store 30 thus reducing the area impact to the chip design. GPTR store 30 would be loaded through a generally available mechanism such as a JTAG.

PSTORE 40 holds the LBIST program, which could be loaded as a ROM personality, by a manufacturing tester, or through JTAG by the customer. PSTORE 40 can be growable and could be easily altered to fit customer needs. Further, an external service processor, with a flash memory, can be used to change programming for a chip on a system board. Program control register (PC) 44 is coupled to PSTORE 40 to provide the address of the next instruction to be executed in testing of the chip through the LBIST program PC Increment 42 increments, resets the next program address to be clocked into PC 44 and has as its input gate 16 (MUX) which provides either the prior instruction address or a computed value from the ALU 15 as an input. The address bus for this design is 8 bits wide to address up to 256 instructions but it's width could be increased to handle programs larger than 256 instructions. Moreover, a zero check 19 is arranged between the output of ALU 15 and an input to control logic 10.

Finally, PSTORE 40 is coupled to one write and two read ports of REGFILE 20 in such a manner that each port receives three data bits to allow addressing of any of the 8 registers in REGFILE 20. The number of data bits could be increased along with the number of registers in REGFILE 20 if more registers were needed. Thus, PSTORE 40, which runs microcontroller 1 and holds various steps related to LBIST in order to program test clocks, and REGFILE 20 are shown as 16 bits wide but could be wider if needed.

The above-noted microcontroller is understood to be a non-limiting example of a controller for at speed structural testing of a chip. Further, the general purpose circuit can be easily configured to any ASIC design that has in place structure for at speed structural testing, and the programmable such that the controller can be reloaded with new programs for LBIST. Also, the chip can be set up by programming the GPTR sequence onto the chip. As noted above, because the controller can also be tied to JTAG, which is a industry standardized test mechanism, customers can access and run LBIST. Moreover, in accordance with the instant invention, the circuit design is small, e.g., 3,000-4,000 gates (not counting the program storage memory or the GPTR store).

The GPTR store 30 width can be determined by the specific design. For example, for a ten (10) clock domain design with 4 PLLs, GPTR width with present deskewer definitions as described in copending U.S. patent application Ser. No. 10/906,407 would be about 400 latches/test (line), and ten (10) lines would be needed to test all domains. A line of about 120 bits would be needed for each unique setup of the PLLs but typically this would be done once. Therefore, to minimize GPTR store 30, one might, e.g., minimize the number of latches in the deskewer by either limiting the size of the divider or devising deskewers based on customer's divider ratio; utilize some form of compression/decompression; utilize a template for use in loading scan chains along with program code to do the load; or utilize GPTR ordering, i.e., as the deskewers have a limited number of program values, load based upon count and test sequences selected.

GPTR store 30 can contain a number of test sequences in which each test sequence is associated with a respective line to be applied to the chip under test. Moreover, GPTR store 30 can contain information regarding, e.g., the number of test sequences (which is generally 1 per domain); number of scan cycles to load pattern into GPTR 30; number of test passes/ sequences (generally the scan chain loaded from LSFR); number of scan cycles to load scan chains from LSFR; and number of clock cycles of the microcontroller to wait for completion of ASST test or for a PLL to lock on a new frequency. As an alternative, the information can be stored in PSTORE 40. However, this alternative generally increases the number of instructions, and, therefore, the number of address bits required and therefore the number of logic gates required for circuits 16, 42, 17, and 44 as well as the size of PSTORE 40.

According to the invention, as described in copending U.S. patent application Ser. No. 10/906,407, the deskewer allows the ability to turn on and off clock domains as needed. Further, deskewers sit at the outputs of the PLL and allow only clock pulses out as programmed. The program in microcontroller 1 allows the clocks to start running and then the deskewer allows pulses through as programmed by microcontroller 1. Thus, with the PLL and deskewer, complete clock control can be obtained, e.g., frequency and the desired clock pulses out can be programmed. By the use of an LSFR, a pseudorandom test pattern can be scanned into the chip under test by the microcontroller 1. In this regard, each subsequent test pass produces a signature and using a device, such as a multiple input signature register (MISR), a cumulative signature resulting from each pattern is obtained. By controlling the clock outputs, the test sequences can compare the final output of the MISR of the chip under test to a known or expected output to determine whether the chip structure is acceptable.

Further, some instructions stored in PSTORE 40 are ALU instructions, i.e., data from REGFILE 20 through ALU 15 to REGFILE 20. By way of example, the instructions can be formatted in order to instruct to add two registers and store the result; to increment/decrement a register and store the result; AND two registers and store the result; invert a register and store the result. Other instructions include: move data from one register to another; move data (specific bits) from REGFILE 20 to PC 44; move data from GPTR store 30 to REGFILE 20; move data (specific bits) to REGFILE 20; jump to new instruction; and jump to new instruction when zero.

Figure 2:
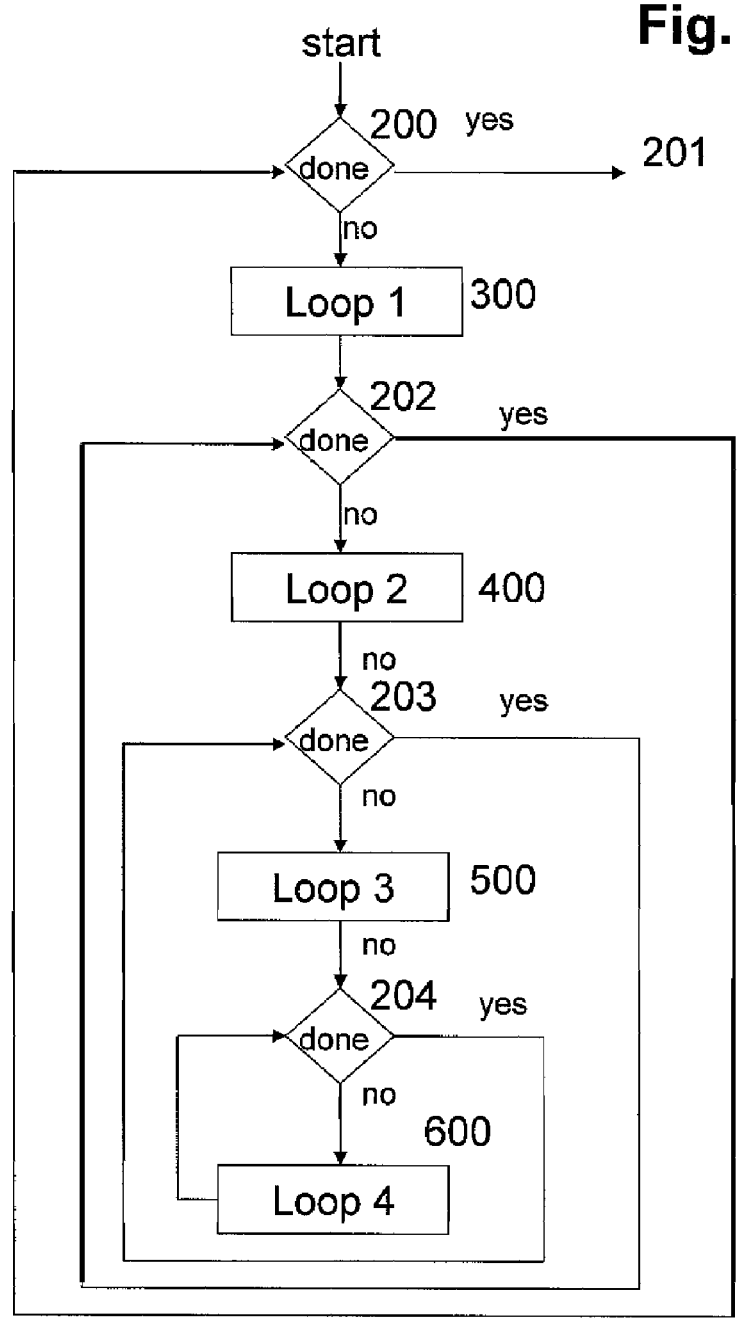
FIGS. 2-6 illustrate an exemplary flow diagram of a program in accordance with the instant invention.
Figure 3:
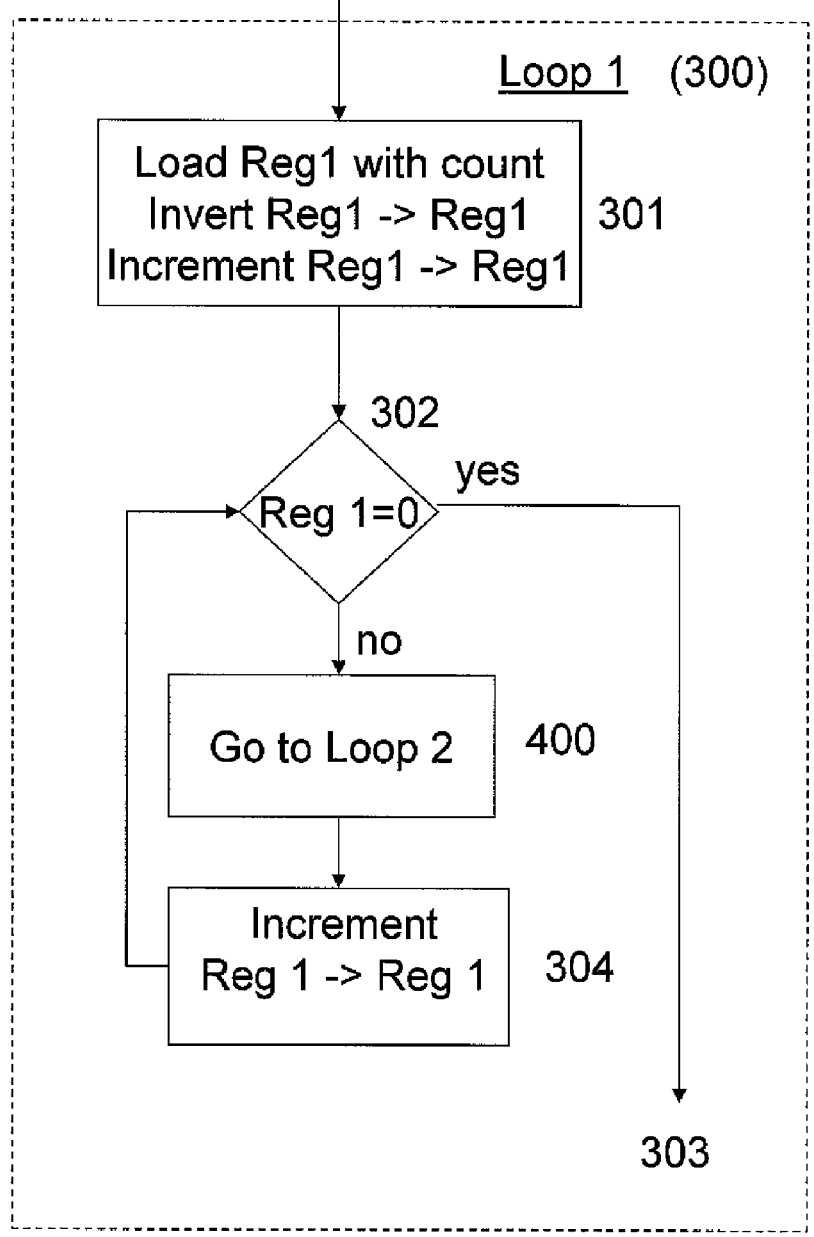
Figure 4:
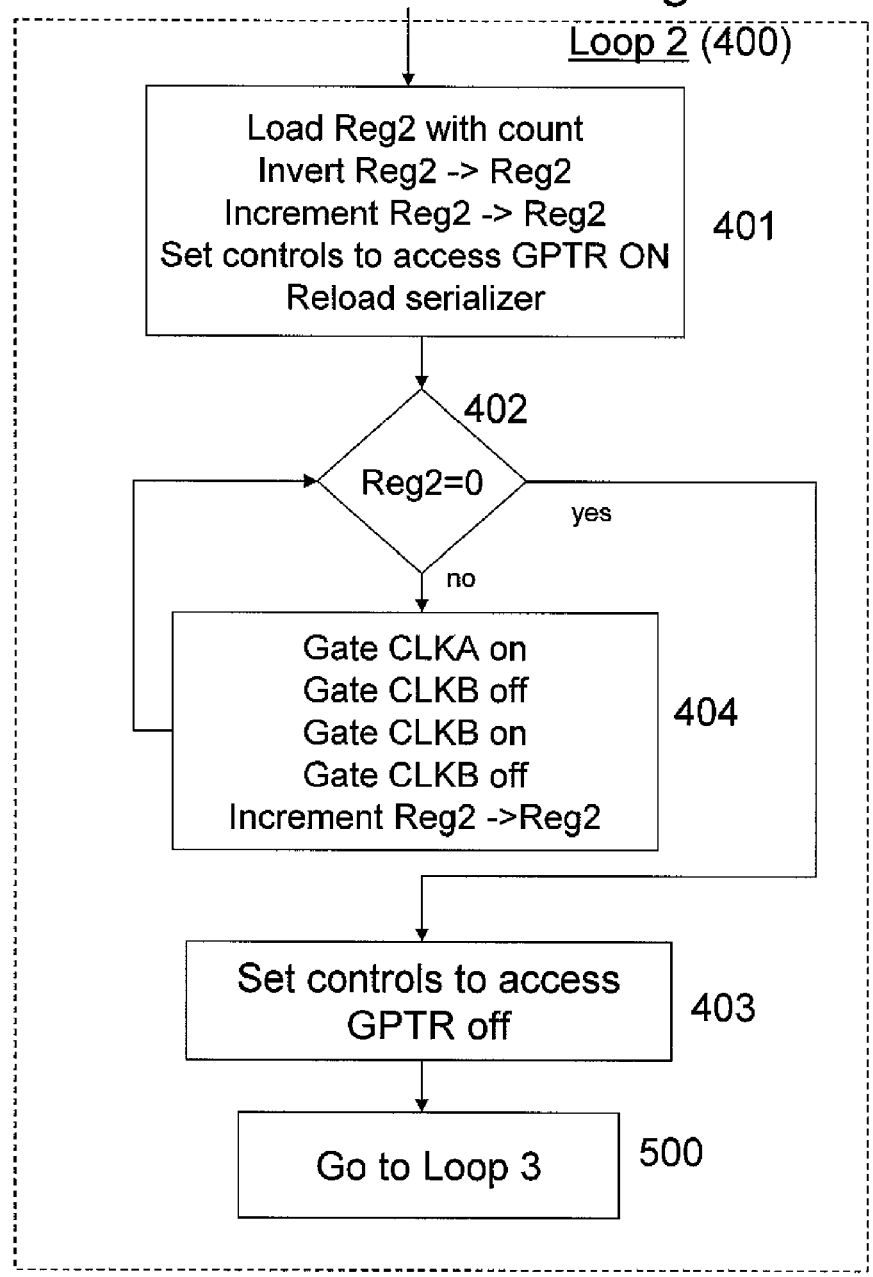
Figure 5:
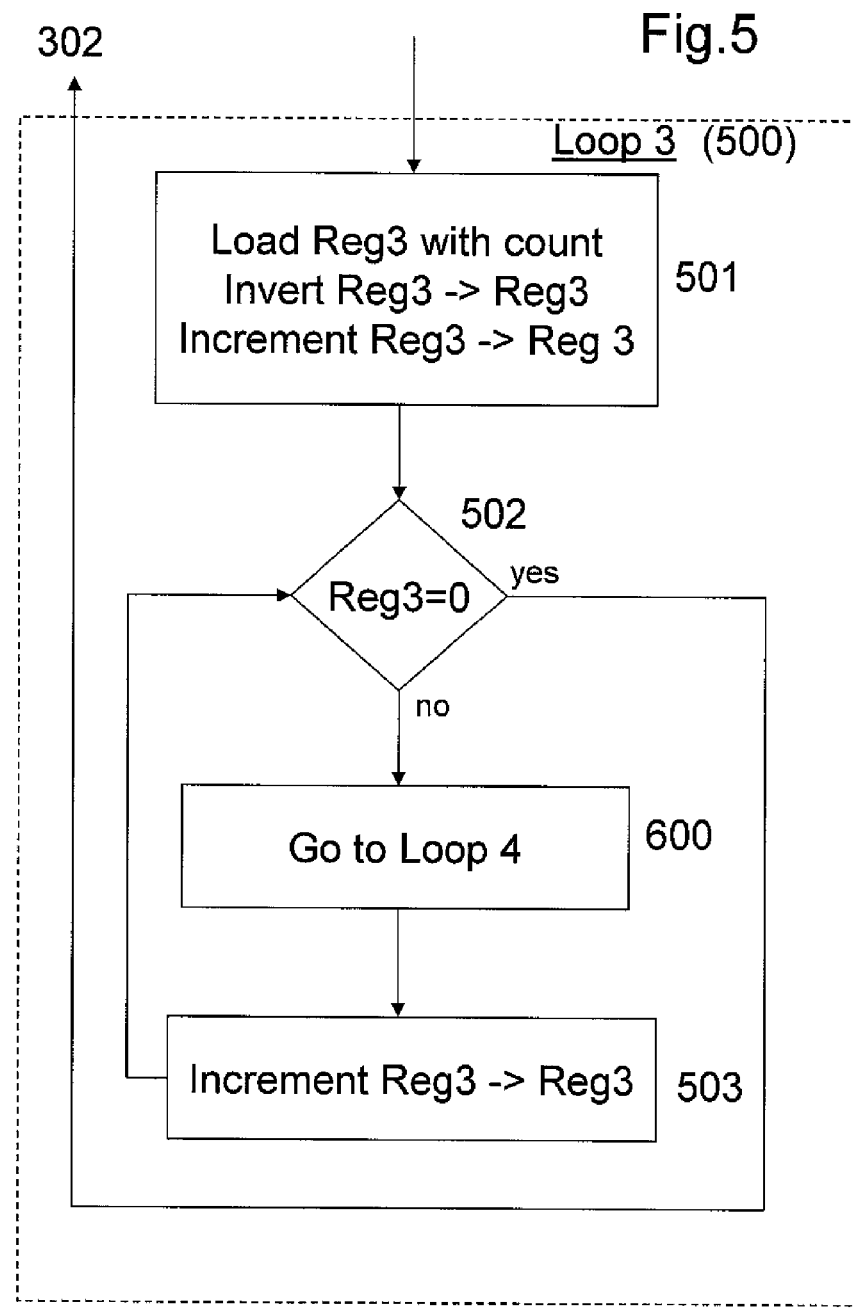
Figure 6:
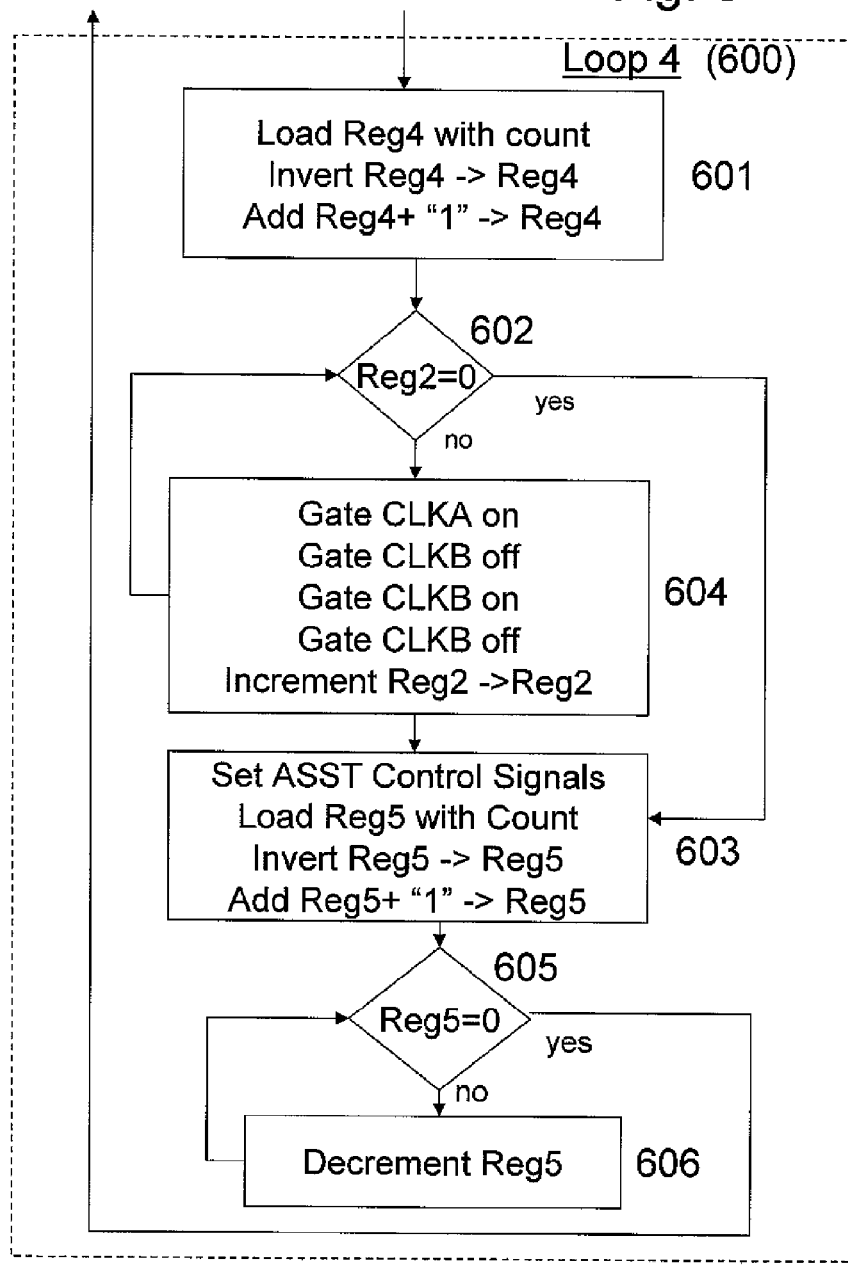

By way of example, an exemplary overall program flow is illustrated in FIG. 2, which shows the test sequence flow through loop 1 (300) illustrated in FIG. 3; loop 2 (400) illustrated in FIG. 4; loop 3 (500) illustrated in FIG. 5; and loop 4 (600 illustrated in FIG. 6. As shown in FIG. 2, at the start of the test an initial check is made at 200 whether the test is complete. If complete the test ends at 201; otherwise, the test continues to loop 1 (300), see FIG. 3, to determine the number of test sequences. Once loop 1 (300) is complete at 202, the program returns to the inquiry at 201; otherwise, the program proceeds to loop 2 (400), see FIG. 4, to determine the number of cycles to load GPTRs. Once loop 2 (400) is complete at 203, the program returns to the inquiry at 202; otherwise, the program proceeds to loop 3 (500), see FIG. 5, to determine the number of passes per GPTR setup. Once loop 3 (500) is complete at 204, the program returns to the inquiry at 203; otherwise, the program proceeds to loop 4 (600), see FIG. 6, to determine the number of scans per ASST test. Once loop 4 (600) is complete at 204, the program returns to the inquiry at 203; otherwise, the program continues until loop 4 (600) is completed. Additional detail is shown below with reference to FIGS. 3-6.

As shown in FIG. 3, a register, e.g., register 1 in REGFILE 20, is loaded with a count corresponding to the number of test sequences needed to complete the test at 301 (to inquire how many different tests are to be performed) and a determination is made at 302 whether the count is zero. If the count is zero, the test is finished at 303; otherwise, the program moves to loop 2 (400) shown in FIG. 4. At the end of loop 2 (400), the register is decremented at 304 and a determination is again made at 302 whether the count is zero. Loop 2 (400) continues until the program can proceed to 303.

When the program enters loop 2 (400) in FIG. 4, a register, e.g., register 2 in REGFILE 20, is loaded with a count for the number of scan cycles needed to load the GPTR and sets controls to access the GPTR on at 401 (to inquire how many scan clocks are to be loaded into GPTR) and a determination is made at 402 whether the count is zero. If the count is zero, the program sets controls to access GPRT off at 403 and proceeds to loop 3 (500) shown in FIG. 5; otherwise, the program gates clocks A and B and decrements the count at 404. This loop continues until the count is zero at 403.

When the program enters loop 3 (500) in FIG. 5, a register, e.g., register 3 in REGFILE 20, is loaded with a count for the number of loops needed per test sequence, i.e., the GPTR load, at 501 (to inquire how passes for a GPTR are needed) and a determination is made at 502 whether the count is zero. If the count is zero, the program returns to 302 to determine whether to end the test program; otherwise, the program proceeds to loop 4 (600) shown in FIG. 6. After loop 4 (600), the count is decremented at 503 and loop 4 (600) continues until the count is zero at 502.

When the program enters loop 4 (600) in FIG. 6, a register, e.g., register 4 in REGFILE 20, is loaded with a count for the number of scan needed to load the scan chain at 601 (to inquire how many scan cycles are needed to load the scan chains) and a determination is made at 602 whether the count is zero. If the count is zero, the program sets ASST control signals and loads a register, e.g., register 5 in REGFILE 20, with the number of clock cycles needed until the ASST test is completed at 603; otherwise, the program gates clocks A and B in 604 until the count at 602 is zero. At 605, a check is made whether the register loaded at 603 is zero. If the count is zero, the program proceeds back to 502 in loop 3 (500); otherwise, the register is decremented until the count is zero at 605.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

While the invention has been described in terms of exemplary embodiments, those skilled in the art will recognize that the invention can be practiced with modifications and in the spirit and scope of the appended claims.

What is claimed:

1. A method, comprising:
    performing an at speed structural test (ASST) of a chip using a microcontroller, wherein the microcontroller comprises:
        a plurality of hardware description language files representing a hierarchical description of the microcontroller, the plurality of hardware description language files including a library of circuit design elements;
        a plurality of temporary library design circuit elements enabling a logic BIST (built-in self-test); and
        a plurality of latches adapted to store a plurality of values corresponding to a behavioral profile of a test clock.

2. The method in accordance with claim 1, wherein said plurality of temporary library design circuit elements comprise storage elements that store instructions and data generated during manufacturing test.

3. The method in accordance with claim 2, wherein the storage elements comprise a read only memory (ROM).

4. The method in accordance with claim 2, wherein the storage elements comprise a random access memory (RAM).

5. The method in accordance with claim 1, wherein the plurality of latches comprise clock gating latches.

6. The method in accordance with claim 1, wherein the microcontroller includes a control logic that receives an instruction from a program store and decomposes the instruction into necessary control signals that determine what operation an arithmetic logic unit (ALU) is to perform.

7. The method in accordance with claim 1, wherein the microcontroller utilizes a general purpose microcontroller using scan data determined during a manufacturing test to run the logic BIST.

8. The method in accordance with claim 1, wherein the microcontroller provides a library core to programmably set up clock trees for the at speed structural test (ASST) that uses scan bit data generated during a manufacturing test to set up the clock trees.

9. The method in accordance with claim 1, wherein the microcontroller includes a control logic that receives an instruction from a program store and decomposes the instruction into necessary control signals that determine how data is to flow through the control logic.

10. The method in accordance with claim 1, wherein the microcontroller is programmable and can be reloaded with programs for the logic BIST.

11. A method of testing a chip, comprising:
 loading a plurality of registers of a register file with data; and
 performing an at speed structural test (ASST) of a chip using the data, wherein the loading the plurality of registers includes:
  loading a first register of the plurality of registers with a count corresponding to a number of test sequences to complete the ASST;
  loading a second register of the plurality of registers with a count of a number of scan cycles to load a general purpose test register (GPTR) store;
  loading a third register of the plurality of registers with a count of a number of loops per test sequence;
  loading a fourth register of the plurality of registers with a count of a number of scan cycles to load a scan chain; and
  loading a fifth register of the plurality of registers with a number of clock cycles until the ASST is complete.

12. The method in accordance with claim 11, wherein the GPTR store contains the test sequences.

13. The method in accordance with claim 12, wherein a respective one of the test sequences is associated with a respective line applied to a chip under test.

14. The method in accordance with claim 11, further comprising holding, in the GPTR store, data bits added into a deskewer for clock formatting.

15. The method in accordance with claim 11, further comprising holding, in the GPTR store, program bits used in phase locked loop (PLL) control during testing the chip.

16. The method in accordance with claim 11, further comprising holding, in the GPTR store, data for a LBIST (logic built-in self-test) which was generated during a manufacturing test.

17. The method in accordance with claim 11, further comprising using a deskewer arranged at outputs of a phase locked loop (PLL) to provide clock pulses used in the ASST.

\* \* \* \* \*